United States Patent
Sun

(10) Patent No.: US 6,825,730 B1
(45) Date of Patent: Nov. 30, 2004

(54) HIGH-PERFORMANCE LOW-NOISE CHARGE-PUMP FOR VOLTAGE CONTROLLED OSCILLATOR APPLICATIONS

(75) Inventor: Runhua Sun, Tustin, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

(21) Appl. No.: 10/403,606

(22) Filed: Mar. 31, 2003

(51) Int. Cl.[7] .................................................. H03L 7/00

(52) U.S. Cl. ............................ 331/16; 331/17; 331/175

(58) Field of Search ........................... 331/16, 17, 175; 330/258

(56) References Cited

U.S. PATENT DOCUMENTS 6,169,458 B1 * 1/2001 Shenoy et al. ................ 331/17

OTHER PUBLICATIONS

Momtaz et al., "A Fully Integrated SONET OC–48 Transceiver in Standard CMOS", IEEE Journal of Solid–State Circuits, vol. 36, No. 12, Dec. 2001, pp. 1964–1972.

* cited by examiner

Primary Examiner—Michael B. Shingleton
(74) Attorney, Agent, or Firm—Law Office of Gerald Maliszewski; Gerald Maliszewski

(57) ABSTRACT

A charge-pump and a method are provided for conditioning the phase detector output in a phase-locked loop (PLL). The method comprises: accepting a pair of differential phase detector (PD) output signals (up/upb and dn/dnb); connecting each pair of differential PD outputs to first and second charge-pump differential sections; supplying differential charge-pump outputs (Vout+/Vout−) in response to the pair of differential PD output signals; and, disconnecting the charge-pump differential section outputs from the loop filter inputs when the PD differential outputs (up/dn and upb/dnb) are equal. In some aspects, supplying differential charge-pump outputs (Vout+/Vout−) in response to the pair of differential PD output signals includes sourcing a first current through the first charge-pump differential section and sourcing a second current through the second charge-pump differential section. Then, the method further comprises maintaining the first current equal to the second current.

20 Claims, 5 Drawing Sheets

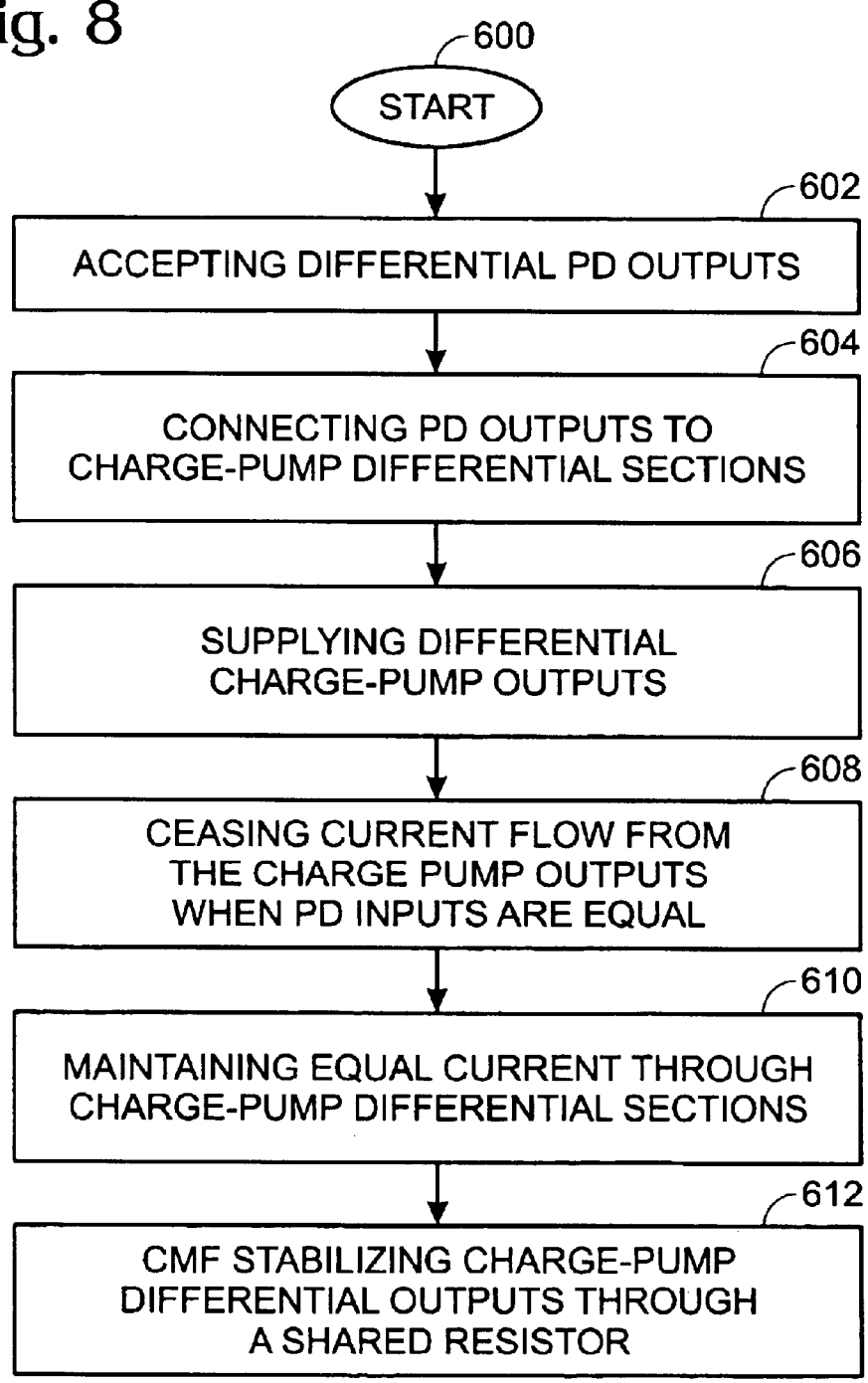

HIGH-PERFORMANCE LOW-NOISE CHARGE-PUMP FOR VOLTAGE CONTROLLED OSCILLATOR APPLICATIONS

BACKGROUND OF THE INVENTION

1. Field of the Invention

This invention generally relates to CMOS transistor circuitry and, more particularly, to an improved differential charge-pump suitable for use in a phase-locked loop (PLL) control system.

2. Description of the Related Art

FIG. 1 is a schematic block diagram of a conventional phase locked loop (prior art). A phase detector (or frequency detector) receives a first input signal, such as might be supplied on a serial data stream or a clock source, and compares it to a second input signal supplied by the divider. The phase detector (PD) generates an output that is responsive to difference in timing between the two input signals. The charge-pump is typically added to improve the response of the PLL, as the phase detector output does not necessarily have enough drive to instantaneously charge (or discharge) the loop filter reactances. The loop filter is typically a low-pass filter, and is used to control the overall loop response. The voltage controlled oscillator (VCO) supplies an output frequency that is responsive to the input voltage level. The loop is locked when the phase detector inputs match. The divider may be inserted in the path between the VCO and the phase detector.

Charge-pump PLL architecture offers two important advantages: 1) the capture range is only limited by the VCO output frequency range; 2) the static phase error is zero if mismatches and offsets are negligible, as the charge-pumps provide an infinite gain for a static phase difference at the input of the PFD. A wide acquisition range is often necessary because the VCO center frequency may vary considerably with process and temperature. In many applications, the acquisition range of a conventional PLL is inadequate. Since the output of charge-pump is directly connected to the loop filter, the VCO performance is highly dependent upon the quality of charge-pump. Noise generated or transferred by the charge-pump appears as VCO phase noise. Furthermore, a low output swing charge-pump translates into a smaller VCO tuning range, and smaller PLL acquisition range. To build a PLL with low jitter and a large capture range, a high performance low-noise charge-pump is required.

FIG. 2 is a schematic drawing illustrating a conventional differential charge-pump (prior art). Any noise generated by power supplies, radiated frequency sources, or conducted frequency sources, introduced into PLL signal voltages, can be translated into VCO frequency jitter. These noise susceptibilities can be reduced through the use of differential signals. Noise that becomes superimposed on a differential signal is effectively cancelled. To that end, differential charge-pumps have been designed to condition the differential outputs of a phase detector.

FIG. 3 is a timing diagram illustrating the output of the phase detector in the lock condition (prior art). Tref is the total time period of reference clock and Treset is the reset pulse width for avoiding death zone in phase detector. As shown in FIG. 2, the outputs of the charge-pump, Vout+ and Vout−, are always connected to loop filter, during both the Treset and Ts periods. In other words, the noise contributed from charge-pump is added to the VCO control voltage, through the loop filter, at all times. Obviously, this architecture can be a source of jitter. The other drawback of this approach is that the output voltage range is limited by both p-type and n-type current sources: Icp and Icn. In general, those current sources consist of cascaded transistors with small voltage output swings.

It would be advantageous if a differential charge-pump could be made more responsive for use in large output voltage swing PLL applications.

It would be advantageous if a differential charge-pump could be disconnected from the loop filter when a PLL was locked, to reduce VCO jitter.

SUMMARY OF THE INVENTION

The present invention is an improved differential charge-pump. The fully differential charge-pump provides a lower output noise and increased output swing, as compared to conventional designs. The performance of the improved charge-pump makes it suitable for use in CMOS OC-192 transceiver applications, for example.

Accordingly, a method is provided for conditioning the phase detector output in a PLL including a phase detector, a charge-pump, and a loop filter. The method comprises: accepting a pair of differential phase detector (PD) output signals (up/upb and dn/dnb); connecting each pair of differential PD outputs to first and second charge-pump differential sections; supplying differential charge-pump outputs (Vout+/Vout−) in response to the pair of differential PD output signals; and, disconnecting the charge-pump differential section outputs from the loop filter inputs when the PD differential outputs (up/dn and upb/dnb) are equal (when the loop is locked).

In some aspects, supplying differential charge-pump outputs (Vout+/Vout−) in response to the pair of differential PD output signals includes sourcing a first current through the first charge-pump differential section and sourcing a second current through the second charge-pump differential section. Then, the method further comprises maintaining the first current equal to the second current.

Additional details of the above-described charge-pump are provided below.

BRIEF DESCRIPTION OF THE DRAWINGS

FIG. 8 is a flowchart illustrating the present invention method for conditioning a phase detector output, in a PLL including a phase detector, a charge-pump, and a loop filter.

DETAILED DESCRIPTION OF THE PREFERRED EMBODIMENTS

Figure 4:
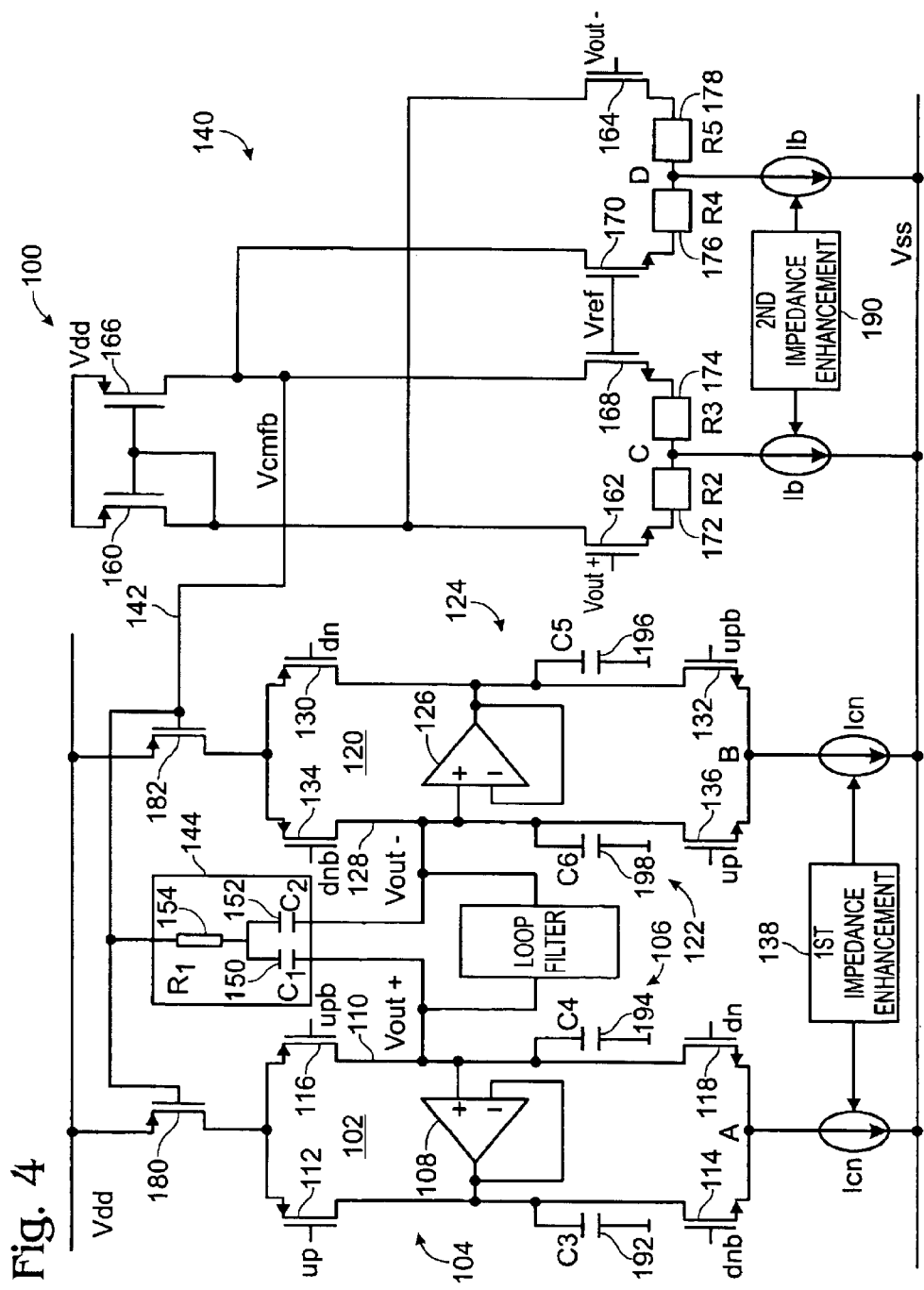
FIG. 4 is a schematic diagram of the present invention PLL charge-pump.

FIG. 4 is a schematic diagram of the present invention PLL charge-pump. The charge-pump 100 comprises a first differential section 102 including two cascaded transistor pairs 104 and 106. A first unity-gain operational amplifier (op amp) 108 is interposed between the cascaded pairs 104 and 106. An output (Vout+) is connected to a loop filter first port on line 110. Each transistor is connected to a corresponding one of a pair of differential phase detector outputs (up/upb and dn/dnb). That is, transistor 112 is connected to up, transistor 114 is connected to dnb, transistor 116 is connected to upb, and transistor 118 is connected to dn.

A second differential section 120 includes two cascaded transistor pairs 122 and 124, with a second unity-gain op amp 126 interposed between the cascaded pairs. An output (Vout−) is connected to a loop filter second port on line 128, differential to the first differential section first output on line 110. Each transistor is connected to a corresponding one of the pair of differential phase detector outputs (up/upb and dn/dnb). That is, transistor 130 is connected to dn, transistor 132 is connected to upb, transistor 134 is connected to dnb, and transistor 136 is connected to up.

A first impedance enhancement circuit 138 sources current for the first and second differential sections 102/120. A common-mode feedback circuit (CMFB) 140 has differential inputs connected to the first and second differential section outputs (Vout+/Vout−) on lines 110 and 128, respectively, and an output (Vcmfb) on line 142. A common-mode feedback stabilizing filter 144 is interposed between common-mode feedback circuit output (Vcmfb) on line 142 and the first and second differential section outputs (Vout+/Vout−) on lines 110 and 128, respectively.

Figure 5:
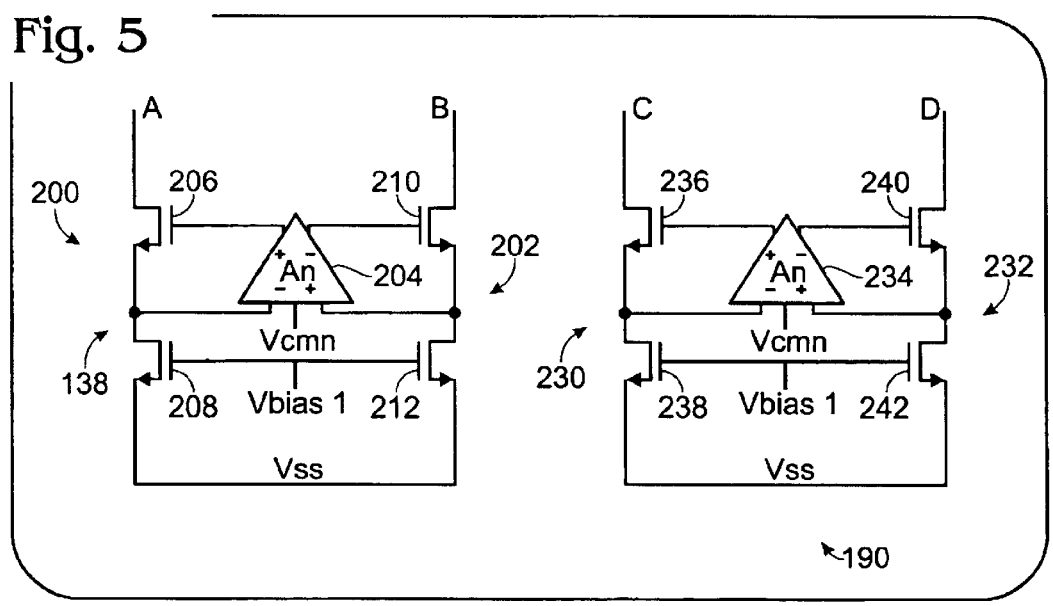
FIG. 5 is a schematic illustrating exemplary impedance enhancement circuitry, such as may be used to enable the impedance enhancement circuit of FIG. 4.

FIG. 5 is a schematic illustrating exemplary impedance enhancement circuitry, such as may be used to enable the impedance enhancement circuit 138 of FIG. 4. The first impedance enhancement circuit 138 includes a cascaded transistor pair 200 connected to source current for the first differential section (at node A). A cascaded transistor pair 202 is connected to source current for the second differential section (at node B). A first differential amplifier 204 (An) is interposed between the transistors pairs 200/202.

More specifically, a first field effect transistor (FET) 206 has a drain connected to the first differential section (at node A). The "arrows" represent the FET source. An arrow pointing towards the gate represents a PMOS FET, while an arrow pointing away from the gate represents an NMOS FET. A second FET 208 has a drain connected to the first FET 206 source, a source connected to a reference voltage supply (Vss), and a gate connected to a first bias voltage (Vbias1). A third field FET 210 has a drain connected to the second differential section at node B. A fourth FET 212 has a drain connected to the third FET 210 source, a source connected to the reference voltage supply (Vss), and a gate connected to the first bias voltage (Vbias1).

The first differential amplifier 204 includes a positive input (Vin+) connected to the source of the third FET 210, a negative input (Vin) connected to the source of the first FET 206, a positive output (V+) connected to the gate of the first FET 206, and a negative output (V−) connected to the gate of the third FET 210. Note that the specific impedance enhancement circuit embodiment will be dependent upon PLL design goals. Alternately stated, there are other impedance enhancement embodiments that might prove useful with the charge-pump of FIG. 4.

Returning to FIG. 4, the common-mode feedback stabilizing filter 144 may include a first capacitor C1 (150) having a first terminal connected to the first differential section output (Vout+) on line 110. A second capacitor C2 (152) has a first terminal connected to the second differential section output (Vout−) on line 128 and a second terminal connected to the first capacitor 150 second terminal. A first resistor R1 (154) has a first terminal connected to the second terminals of the first and second capacitors 150/152, and a second terminal connected to the common-mode feedback circuit output (Vcmfb) on line 142.

The first differential section 102 includes a fifth FET 112 having a source operatively connected to a first power supply (Vdd) and a gate connected to a first phase detector (PD) output (up). As used herein, the term "operatively connected" means indirectly connected or connected through an intervening element. A sixth FET 114 has a drain connected to the drain of the fifth FET 112, a source connected to the drain of the first FET (206, see FIG. 5), and a gate connected to a second differential PD output (dnb).

A seventh FET 116 has a source operatively connected to the first power supply (Vdd) and a gate connected to a first PD differential output (upb). An eighth FET 118 has a drain connected to the drain of the seventh FET 116 and the output (Vout+) on line 110. The eighth FET 118 has a source connected to the drain of the first FET (see FIG. 5) and a gate connected to a second PD output (dn). The first unity gain amplifier 108 has a positive input connected to the drain of the seventh FET 116, a negative input connected to the drain of the fifth FET 112, and an output connected to the drain of the fifth FET 112.

The second differential section 120 includes a ninth FET 130 having a source operatively connected to the first power supply (Vdd) and a gate connected to the second PD output (dn). A tenth FET 132 has a drain connected to the drain of the ninth FET 130, a source connected to the drain of the third FET (see FIG. 5), and a gate connected to the first differential PD output (upb).

An eleventh FET 134 has a source operatively connected to the first power supply (Vdd) and a gate connected to the second PD differential output (dnb). A twelfth FET 136 has a drain connected to the drain of the eleventh FET 134 and the output (Vout−) on line 128. The twelfth FET 136 has a source connected to the drain of the third FET (see FIG. 5) and a gate connected to the first PD output (up). The second unity gain amplifier 126 has a positive input connected to the drain of the eleventh FET 134, a negative input connected to the drain of the ninth FET 130, and an output connected to the drain of the ninth FET 130.

Figure 6:
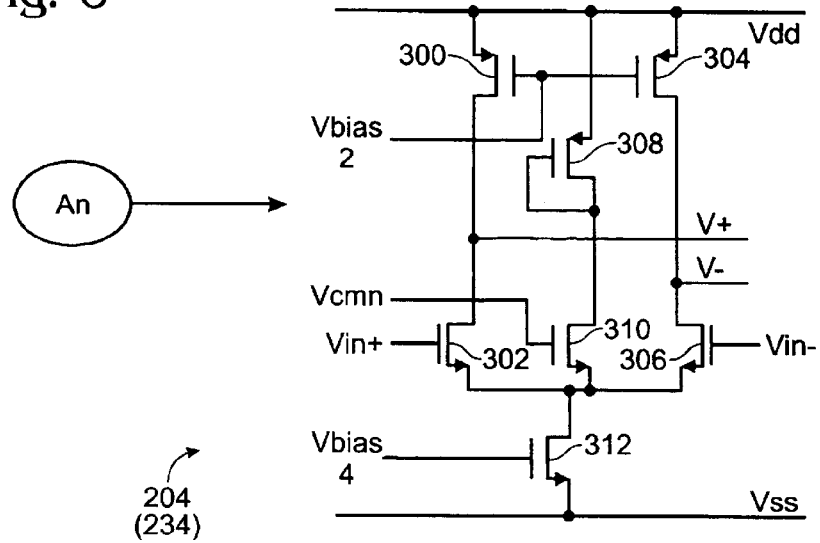
FIG. 6 is a schematic illustrating an exemplary differential amplifier, such as might to used to enable the first differential amplifier (An) of FIG. 5.

FIG. 6 is a schematic illustrating an exemplary differential amplifier, such as might to used to enable the first differential amplifier 204 (An) of FIG. 5. A thirteenth FET 300 has a source connected to the first power supply (Vdd) and a gate connected to a second bias voltage (Vbias2). A fourteenth FET 302 has a drain connected to the drain of the thirteenth FET 300 and the gate of the first FET (V+, see FIG. 5), and a gate connected to the drain of the fourth FET (Vin+, see FIG. 5). A fifteenth FET 304 has a source connected to the first power supply (Vdd) and a gate connected to the second bias voltage (Vbias2).

A sixteenth FET 306 has a drain connected to the drain of the fifteenth FET 304 and the gate of the third FET (V−, see FIG. 5), a gate connected to the drain of the second FET (Vin−, see FIG. 5), and a source connected to the source of the fourteenth FET 302. A seventeenth FET 308 has a source connected to the first power supply (Vdd) and a drain connected to its gate. An eighteenth FET 310 has a drain connected to the drain of the seventeenth FET 308, a gate connected to a third bias voltage (Vcmn), and a source connected to the source of the fourteenth FET 302. A nineteenth FET 312 has a drain connected to the source of the fourteenth FET 302, and gate connected to a four bias voltage (Vbias4), and a source connected to the reference voltage (Vss).

Returning to FIG. 4, an exemplary common-mode feedback circuit 140 is detailed. However, it should be understood that other common-mode feedback designs might be used effectively. As shown, the common-mode feedback circuit 140 includes a twentieth FET 160 having a source connected to the first power supply (Vdd) and a drain connected to its gate. A twenty-first FET 162 has a drain connected to the drain of the twentieth FET 160 and a gate connected to the first differential section output (Vout+) on line 110. The line is not shown connected in the interest of clarity. A twenty-second FET 164 has a drain connected to the drain of the twentieth FET 160 and a gate connected to the second differential section output (Vout−) on line 128.

A twenty-third FET 166 has a source connected to the first power supply (Vdd) and a gate connected to the gate of the twentieth FET 160. A twenty-fourth FET 168 has a drain connected to the drain of the twenty-third FET 166 and a gate connected to a fifth bias voltage (Vref). A twenty-fifth FET 170 has a drain connected to the drain of the twenty-third FET 166 and a gate connected to the fifth bias voltage (Vref).

A second resistor (R2) 172 has a first terminal connected to the source of the twenty-first FET 162. A third resistor (R3) 174 has a first terminal connected to the source of the twenty-fourth FET 168 and the second terminal connected to the second terminal of the resistor 172. A fourth resistor (R4) 176 has a first terminal connected to the source of the twenty-fifth FET 170. A fifth resistor (R5) 178 has a first terminal connected to the source of the twenty-second FET 164. The first terminal of the fifth resistor 178 is also connected to the second terminal of the fourth resistor 176.

A twenty-sixth FET 180 has a source connected to the first power supply (Vdd), a gate connected to the drain of the twenty-third FET 166 and the first resistor 154 second terminal (Vcfmb), and a drain connected to the sources of the fifth and seventh FETs 112/116. A twenty-seventh FET 182 has a source connected to the first power supply (Vdd), a gate connected to the drain of the twenty-third FET 166 (Vcmfb), and a drain connected to the sources of the ninth and eleventh FETs 130/134.

In some aspects, the charge-pump 100 further comprises a second impedance enhancement circuit 190 having inputs connected to the second and third resistor 172/174 second terminals (node C), and the fourth and fifth resistor 176/178 second terminals (node D).

In other aspects, the first differential section 102 further includes a third capacitor (C3) 192 with a first terminal connected to the drain of the fifth FET 112 and a second terminal connected to ground, or a reference voltage. A fourth capacitor (C4) 194 has a first terminal connected to the drain of the seventh FET 116 and a second terminal connected to ground. Likewise, the second differential section 120 may include a fifth capacitor (C5) 196 with a first terminal connected to the drain of the ninth FET 130 and a second terminal connected to ground. A sixth capacitor (C6) 198 has a first terminal connected to the drain of the eleventh FET 134 and a second terminal connected to ground.

Returning to FIG. 5, an exemplary second impedance enhancement circuit is depicted. Note, that although the second impedance circuit 190 is shown to be the same as the first impedance enhancement circuit 138, the two circuits need not necessarily be identical. As shown, the second impedance enhancement circuit 190 includes a cascaded transistor pair 230 connected to source current for the twenty-first and twenty-fourth FETs (see FIG. 4) at node C. A cascaded transistor pair 232 is connected to source current for the twenty-second and twenty-fifth FETs (see FIG. 4) at node D. A second differential amplifier 234 is interposed between the transistors pairs 230/232.

More specifically, the second impedance enhancement circuit 190 includes a twenty-eighth FET 236 having a drain connected to the second and third resistor second terminals (see FIG. 4) at node C. A twenty-ninth FET 238 has a drain connected to the twenty-eighth FET 236 source, a source connected to the reference voltage supply (Vss), and a gate connected to the first bias voltage (Vbias1). A thirtieth FET 240 has a drain connected to the fourth and fifth resistor second terminals (see FIG. 4) at node D. A thirty-first FET 242 has a drain connected to the thirtieth FET 240 source, a source connected to the reference voltage supply (Vss), and a gate connected to the first bias voltage (Vbias1). The second differential amplifier 234 includes a positive input (Vin+) connected to the source of the thirtieth FET 240, a negative input (Vin−) connected to the source of the twenty-eighth FET 236, a positive output (V+) connected to the gate of the twenty-eighth FET 236, and a negative output (V−) connected to the gate of the thirtieth FET 240.

Returning to FIG. 6, the second differential amplifier 234 can be enabled exactly the same as the first differential amplifier 204. A full description will be omitted in the interest of brevity, except to note that the second differential amplifier 234 would include a thirty-second FET as FET 300, a thirty-third FET as FET 302, a thirty-fourth FET as FET 304, a thirty-fifth FET as FET 306, a thirty-sixth FET as FET 308, a thirty-seventh FET as FET 310, and a thirty-eighth FET as FET 312. Note that is some other aspects of the invention, the second differential amplifier 234 may be configured differently than the first differential amplifier 204.

Figure 7:
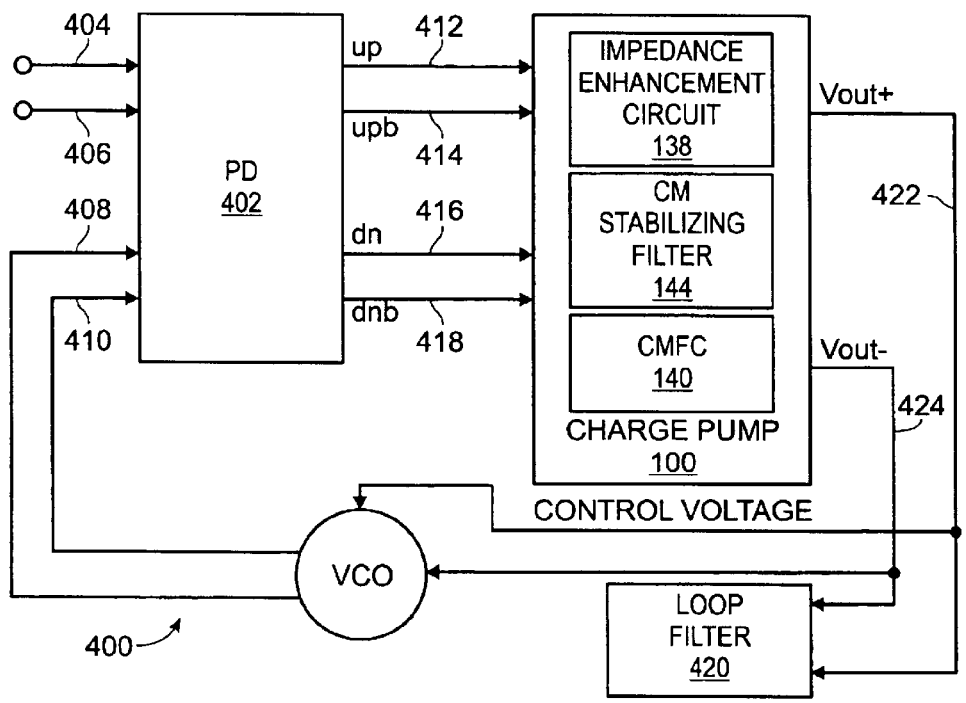
FIG. 7 is a schematic block diagram depicting the present invention phase-locked loop (PLL).

FIG. 7 is a schematic block diagram depicting the present invention phase-locked loop (PLL). The PLL 400 comprises a phase detector (PD) 402 having pair of differential inputs on lines 404/406 and 408/410, and a pair of differential outputs on lines 412/414 and 416/418) (up/upb and dn/dnb). The PLL 400 includes the charge-pump 100 described above in the explanation of FIGS. 4 through 6. Briefly, the charge-pump includes first and second differential sections, a first impedance enhancement circuit 138 sourcing current for the first and second differential sections, a common-mode feedback circuit 140, and a common-mode feedback stabilizing filter 144. In the interest of brevity, the details of the above-mentioned circuits will not be repeated here.

A loop filter 420 has differential ports connected to the charge-pump first and second differential section outputs (Vout+/Vout−) on lines 422 and 424. A voltage controlled oscillator (VCO) 426 has differential inputs connected to the loop filter differential ports on lines 422 and 424 and a frequency output on lines 408/410 responsive to the VCO differential inputs on lines 422/424.

FUNCTIONAL DESCRIPTION

The present invention high performance CMOS charge-pump operates with extremely low noise and a large voltage output swing. Further, the charge-pump design is less susceptible to mismatching. Vdd and Vss are power supply and ground, respectively. The loop filter is differentially connected to the output of charge-pump in a manner that reduces, by half, the size of loop filter's capacitors. The common-mode feedback loop consists of transistors 116, 180, 134, 182, elements R1, C1, C2, and transistors 162, 168, 170, and 164. This loop forces the output common-mode voltage of charge-pump to be same as common-mode reference voltage Vref. The common-mode feedback loop is stabilized with elements R1, C1, and C2. In order to achieve good matching and reduce the resistor size, the two capacitors (C1 and C2) share a single compensation resistor R1.

Figure 1:
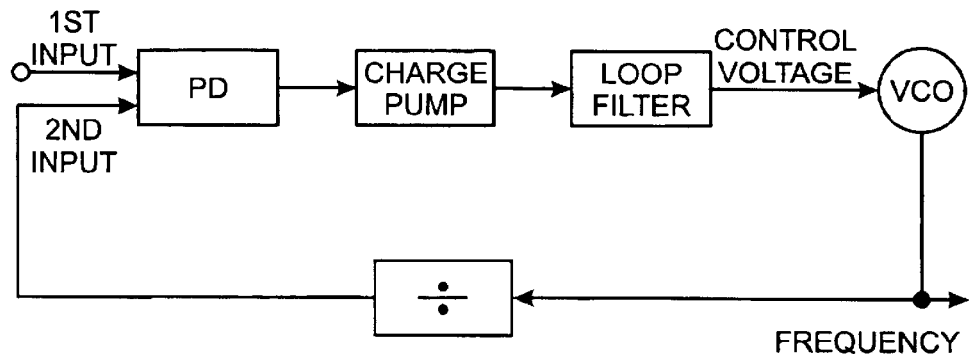
FIG. 1 is a schematic block diagram of a conventional phase locked loop (prior art).
Figure 2:
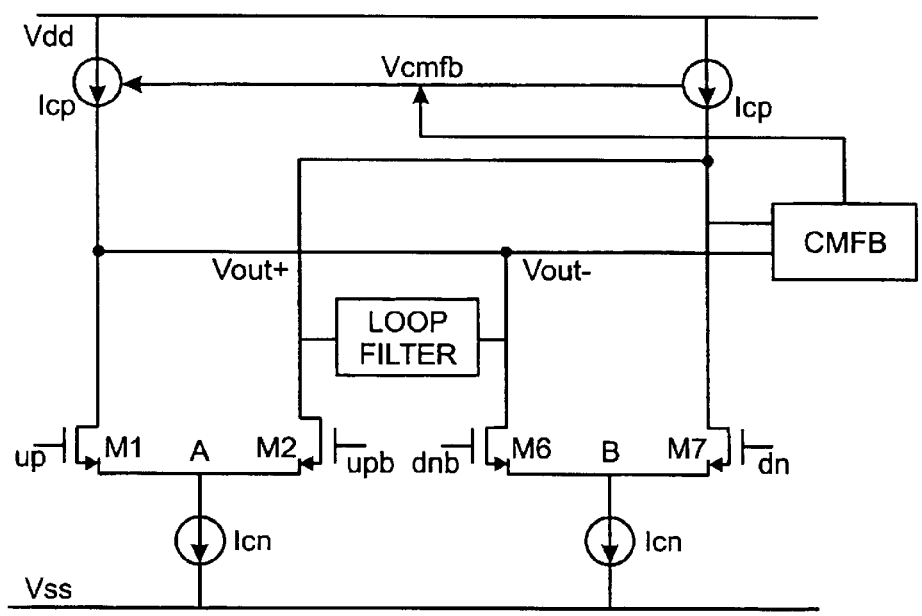
FIG. 2 is a schematic drawing illustrating a conventional differential charge-pump (prior art).
Figure 3:
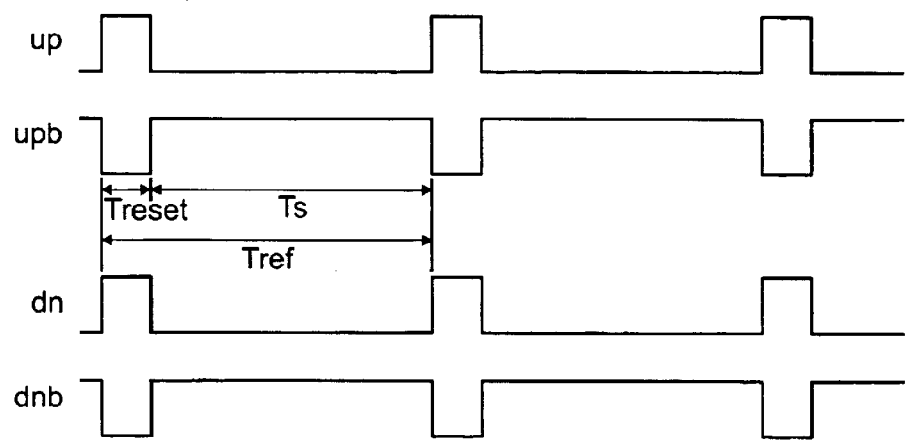
FIG. 3 is a timing diagram illustrating the output of the phase detector in the lock condition (prior art).

Note that the output of charge-pump only connects to the loop filter when up and dn are both high. In the other words, the loop filter is completely disconnected from charge-pump during time period Ts (see FIG. 3). Also note that Ts is much longer than Treset, which is only about 10% of Tref. Consequently, the total noise contributed from charge-pump is decreased dramatically. The output swing is also improved because there is only one transistor 180/182 in the current (p-type) path. A very large VCO tuning range is created in response to the large voltage differentials that are possible between Vout+ and Vout−. In prior art circuitry, the large voltage differences at nodes A and B can dramatically degrade current gain, as the current Icn at node A differs from the current Icn at node B. To address this problem, the present invention has added an impedance enhancement circuit to match the output impedances of current sources. In this manner, the two Icn currents remain the same, regardless of voltage difference between the nodes A and B. Likewise, a second impedance enhancement circuit has been added to address large differential voltages likely to occur between nodes C and D. The second impedance enhancement circuit generally performs the same functions as the first impedance enhancement circuit. That is, the second impedance enhancement circuit maintains equal Ib currents through nodes C and D.

FIG. 8 is a flowchart illustrating the present invention method for conditioning a phase detector output, in a PLL including a phase detector, a charge-pump, and a loop filter. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 600.

Step 602 accepts a pair of differential phase detector (PD) output signals (up/upb and dn/dnb). Step 604 connects each pair of differential PD outputs to first and second charge-pump differential sections. Step 606 supplies differential charge-pump outputs (Vout+Vout−) in response to the pair of differential PD output signals. Step 608 disconnects the charge-pump differential section outputs from the loop filter inputs when the PD differential outputs (up/dn and up/dn) are equal. That is, the differential outputs are disconnected when the PLL is locked.

In some aspects, supplying differential charge-pump outputs (Vout+Vout−) in response to the pair of differential PD output signals in Step 606 includes sourcing a first current through the first charge-pump differential section and sourcing a second current through the second charge-pump differential section. Then, Step 610 maintains the first current equal to the second current. In other aspects, Step 612 common-mode feedback stabilizes the differential charge-pump outputs (Vout+Vout−) through a shared resistor.

A low-noise high-performance differential charge-pump has been described. Simplified circuits were presented to exemplify the inventions. However, the invention is not limited to merely these examples. Other variations and embodiments of the invention will occur to those skilled in the art.

We claim:

1. A phase-locked loop (PLL) charge-pump comprising:
a first differential section including two cascaded transistor pairs, with a first unity-gain operational amplifier (op amp) interposed between the cascaded pairs, an output (Vout+) connected to a loop filter first port, and where each transistor is connected to a corresponding one of a pair of differential phase detector outputs (up/upb and dn/dnb);
a second differential section including two cascaded transistor pairs, with a second unity-gain op amp interposed between the cascaded pairs, an output (Vout−) connected to a loop filter second port, differential to the first differential section first output, and where each transistor is connected to a corresponding one of the pair of differential phase detector outputs (up/upb and dn/dnb);
a first impedance enhancement circuit sourcing current for the first and second differential sections;
a common-mode feedback circuit having differential inputs connected to the first and second differential section outputs (Vout+/Vout−), and an output (Vcmfb); and,
a common-mode feedback stabilizing filter interposed between common-mode feedback circuit output (Vcmfb) and the first and second differential section outputs (Vout+/Vout−).

2. The charge-pump of claim 1 wherein the first impedance enhancement circuit includes:
a cascaded transistor pair connected to source current for the first differential section;
a cascaded transistor pair connected to source current for the second differential section; and,
a first differential amplifier interposed between the transistors pairs.

3. The charge-pump of claim 2 wherein the first impedance enhancement circuit includes:
a first field effect transistor (FET) having a drain connected to the first differential section;
a second FET having a drain connected to the first FET source, a source connected to a reference voltage supply (Vss), and a gate connected to a first bias voltage (Vbias1);
a third field FET having a drain connected to the second differential section;
a fourth FET having a drain connected to the third FET source, a source connected to the reference voltage supply (Vss), and a gate connected to the first bias voltage (Vbias1); and,
wherein the first differential amplifier includes a positive input (Vin+) connected to the source of the third FET, a negative input (Vin−) connected to the source of the first FET, a positive output (V+) connected to the gate of the first FET, and a negative output (V−) connected to the gate of the third FET.

4. The charge-pump of claim 3 wherein the common-mode feedback stabilizing filter includes:
a first capacitor having a first terminal connected to the first differential section output (Vout+);
a second capacitor having a first terminal connected to the second differential section output (Vout−) and a second terminal connected to the first capacitor second terminal; and,
a first resistor having a first terminal connected to the second terminals of the first and second capacitors and a second terminal connected to the common-mode feedback circuit output (Vcmfb).

5. The charge-pump of claim 4 wherein the first differential section includes:
   a fifth FET having a source operatively connected to a first power supply (Vdd) and a gate connected to a first phase detector (PD) output (up);
   a sixth FET having a drain connected to the drain of the fifth FET, a source connected to the drain of the first FET, and a gate connected to a second differential PD output (dnb);
   a seventh FET having a source operatively connected to the first power supply (Vdd) and a gate connected to a first PD differential output (upb);
   an eighth FET having a drain connected to the drain of the seventh FET and the output (Vout+), a source connected to the drain of the first FET, and a gate connected to a second PD output (dn); and,
   wherein the first unity gain amplifier has a positive input connected to the drain of the seventh FET, a negative input connected to the drain of the fifth FET, and an output connected to the drain of the fifth FET.

6. The charge-pump of claim 5 wherein the second differential section includes:
   a ninth FET having a source operatively connected to the first power supply (Vdd) and a gate connected to the second PD output (dn);
   a tenth FET having a drain connected to the drain of the ninth FET, a source connected to the drain of the third FET, and a gate connected to the first differential PD output (upb);
   an eleventh FET having a source operatively connected to the first power supply (Vdd) and a gate connected to the second PD differential output (dnb);
   a twelfth FET having a drain connected to the drain of the eleventh FET and the output (Vout−), a source connected to the drain of the third FET, and a gate connected to the first PD output (up); and,
   wherein the second unity gain amplifier has a positive input connected to the drain of the eleventh FET, a negative input connected to the drain of the ninth FET, and an output connected to the drain of the ninth FET.

7. The charge-pump of claim 6 wherein the first differential amplifier includes:
   a thirteenth FET having a source connected to the first power supply (Vdd) and a gate connected to a second bias voltage (Vbias2);
   a fourteenth FET having a drain connected to the drain of the thirteenth FET and the gate of the first FET (V+), and a gate connected to the drain of the fourth FET (Vin+);
   a fifteenth FET having a source connected to the first power supply (Vdd) and a gate connected to the second bias voltage (Vbias2);
   a sixteenth FET having a drain connected to the drain of the fifteenth FET and the gate of the third FET (V−), a gate connected to the drain of the second FET (Vin−), and a source connected to the source of the fourteenth FET;
   a seventeenth FET having a source connected to the first power supply (Vdd) and a drain connected to its gate;
   an eighteenth FET having a drain connected to the drain of the seventeenth FET, a gate connected to a third bias voltage (Vcmn), and a source connected to the source of the fourteenth FET; and,
   a nineteenth FET having a drain connected to the source of the fourteenth FET, and gate connected to a four bias voltage (Vbias4), and a source connected to the reference voltage (Vss).

8. The charge-pump of claim 7 wherein the common-mode feedback circuit includes:
   a twentieth FET having a source connected to the first power supply (Vdd) and a drain connected to its gate;
   a twenty-first FET having a drain connected to the drain of the twentieth FET and a gate connected to the first differential section output (Vout+);
   a twenty-second FET having a drain connected to the drain of the twentieth FET and a gate connected to the second differential section output (Vout−);
   a twenty-third FET having a source connected to the first power supply (Vdd) and a gate connected to the gate of the twentieth FET;
   a twenty-fourth FET having a drain connected to the drain of the twenty-third FET and a gate connected to a fifth bias voltage (Vref);
   a twenty-fifth FET having a drain connected to the drain of the twenty-third FET and a gate connected to the fifth bias voltage (Vref);
   a second resistor having a first terminal connected to the source of the twenty-first FET;
   a third resistor with a first terminal connected to the source of the twenty-fourth FET and the second terminal connected to the second resistor second terminal;
   a fourth resistor with a first terminal connected to the source of the twenty-fifth FET;
   a fifth resistor with a first terminal connected to the source of the twenty-second FET, the fifth resistor first terminal also connected to the second terminal of the fourth resistor;
   a twenty-sixth FET having a source connected to the first power supply (Vdd), a gate connected to the drain of the twenty-third FET and the first resistor second terminal (Vcfmb), and a drain connected to the sources of the fifth and seventh FETs; and,
   a twenty-seventh FET having a source connected to the first power supply (Vdd), a gate connected to the drain of the twenty-third FET (Vcmfb), and a drain connected to the sources of the ninth and eleventh FETs.

9. The charge-pump of claim 8 further comprising:
   a second impedance enhancement circuit having inputs connected to the second and third resistor second terminals, and the fourth and fifth resistor second terminals.

10. The charge-pump of claim 9 wherein the second impedance enhancement circuit includes:
    a cascaded transistor pair connected to source current for the twenty-first and twenty-fourth FETs;
    a cascaded transistor pair connected to source current for the twenty-second and twenty-fifth FETs; and,
    a second differential amplifier interposed between the transistors pairs.

11. The charge-pump of claim 10 wherein the second impedance enhancement circuit includes:
    a twenty-eighth FET having a drain connected to the second and third resistor second terminals;
    a twenty-ninth FET having a drain connected to the twenty-eighth FET source, a source connected to the reference voltage supply (Vss), and a gate connected to the first bias voltage (Vbias1);

a thirtieth FET having a drain connected to the fourth and fifth resistor second terminals;

a thirty-first FET having a drain connected to the thirtieth FET source, a source connected to the reference voltage supply (Vss), and a gate connected to the first bias voltage (Vbias1); and, wherein the second differential amplifier includes a positive input (Vin+) connected to the source of the thirtieth FET, a negative input (Vin−) connected to the source of the twenty-eighth FET, a positive output (V+) connected to the gate of the twenty-eighth FET, and a negative output (V−) connected to the gate of the thirtieth FET.

12. The charge-pump of claim 11 wherein the second differential amplifier includes:

a thirty-second FET having a source connected to the first power supply (Vdd) and a gate connected to the second bias voltage (Vbias2);

a thirty-third FET having a drain connected to the drain of the thirty-second FET and the gate of the twenty-eighth FET (V+), and a gate connected to the drain of the thirty-first FET (Vin+);

a thirty-fourth FET having a source connected to the first power supply (Vdd) and a gate connected to the second bias voltage (Vbias2);

a thirty-fifth FET having a drain connected to the drain of the thirty-fourth FET and the gate of the thirtieth FET (V−), a gate connected to the drain of the twenty-ninth FET (Vin−), and a source connected to the source of the thirty-third FET;

a thirty-sixth FET having a source connected to the first power supply (Vdd) and a drain connected to its gate;

a thirty-seventh FET having a drain connected to the drain of the thirty-sixth FET, a gate connected to the third bias voltage (Vcmn), and a source connected to the source of the thirty-third FET; and, a thirty-eighth FET having a drain connected to the source of the thirty-third FET, and gate connected to a four bias voltage (Vbias4), and a source connected to the reference voltage (Vss).

13. The charge-pump of claim 12 wherein the first differential section further includes:

a third capacitor with a first terminal connected to the drain of the fifth FET and a second terminal connected to ground; and, a fourth capacitor with a first terminal connected to the drain of the seventh FET and a second terminal connected to ground; and, wherein the second differential section further includes:

a fifth capacitor with a first terminal connected to the drain of the ninth FET and a second terminal connected to ground; and, a sixth capacitor with a first terminal connected to the drain of the eleventh FET and a second terminal connected to ground.

14. A phase-locked loop (PLL) comprising:

a phase detector (PD) having pair of differential inputs and a pair of differential outputs (up/upb and dn/dnb);

a charge-pump including:

a first differential section including two cascaded transistor pairs, with a first unity-gain operational amplifier (op amp) interposed between the cascaded pairs, an output (Vout+) connected to a first loop filter input, and where each transistor is connected to a corresponding one of the pair of differential phase detector outputs (up/upb and dn/dnb);

a second differential section including two cascaded transistor pairs, with a second unity-gain op amp interposed between the cascaded pairs, an output (Vout−) connected to a second loop filter input, differential to the first loop filter input (Vout+), and where each transistor is connected to a corresponding one of the pair of differential phase detector outputs (up/upb and dn/dnb);

a first impedance enhancement circuit sourcing current for the first and second differential sections;

a common-mode feedback circuit having differential inputs connected to the first and second differential section outputs (Vout+/Vout−), and an output (Vcmfb); and, a common-mode feedback stabilizing filter interposed between common-mode feedback circuit output (Vcmfb) and the first and second differential section outputs (Vout+/Vout−);

a loop filter having differential ports connected to the charge-pump first and second differential section outputs (Vout+/Vout−); and, a voltage controlled oscillator (VCO) having differential inputs connected to the loop filter differential ports and a frequency output responsive to the VCO differential inputs.

15. The PLL of claim 14 wherein the first impedance enhancement circuit includes:

a cascaded transistor pair connected to source current for the first differential section;

a cascaded transistor pair connected to source current for the second differential section; and, a first differential amplifier interposed between the transistors pairs.

16. The PLL of claim 15 wherein the first impedance enhancement circuit includes:

a first field effect transistor (FET) having a drain connected to the first differential section;

a second FET having a drain connected to the first FET source, a source connected to a reference voltage supply (Vss), and a gate connected to a first bias voltage (Vbias1);

a third field FET having a drain connected to the second differential section;

a fourth FET having a drain connected to the third FET source, a source connected to the reference voltage supply (Vss), and a gate connected to the first bias voltage (Vbias1); and, wherein the first differential amplifier includes a positive input (Vin+) connected to the source of the third FET, a negative input (Vin−) connected to the source of the first FET, a positive output (V+) connected to the gate of the first FET, and a negative output (V−) connected to the gate of the third FET.

17. The PLL of claim 16 wherein the common-mode feedback stabilizing filter includes:

a first capacitor having a first terminal connected to the first differential section output (Vout+);

a second capacitor having a first terminal connected to the second differential section output (Vout−) and a second terminal connected to the first capacitor second terminal; and, a first resistor having a first terminal connected to the second terminals of the first and second capacitors and a second terminal connected to the common-mode feedback circuit output (Vcmfb).

18. In a phase-locked loop (PLL) including a phase detector, a charge-pump, and a loop filter, a method for conditioning the phase detector output, the method comprising:

accepting a pair of differential phase detector (PD) output signals (up/upb and dn/dnb);

connecting each pair of differential PD outputs to first and second charge-pump differential sections;

supplying differential charge-pump outputs (Vout+/Vout−) in response to the pair of differential PD output signals; and, ceasing current flow between the charge-pump differential section outputs and the loop filter inputs when the PD differential outputs (up/dn and upb/dnb) are equal.

19. The method of claim 18 wherein supplying differential charge-pump outputs (Vout+/Vout−) in response to the pair of differential PD output signals includes sourcing a first current through the first charge-pump differential section and sourcing a second current through the second charge-pump differential section; and, the method further comprising:

maintaining the first current equal to the second current.

20. The method of claim 18 further comprising:

mode feedback stabilizing the differential charge-pump outputs (Vout+/Vout−) through a shared resistor.

* * * * *